US009577116B2

(12) United States Patent
Simola et al.

(10) Patent No.: US 9,577,116 B2
(45) Date of Patent: Feb. 21, 2017

(54) ZENER DIODE HAVING AN ADJUSTABLE LOW BREAKDOWN VOLTAGE

(71) Applicant: STMicroelectronics (Rousset) SAS, Rousset (FR)

(72) Inventors: Roberto Simola, Trets (FR); Pascal Fornara, Pourrieres (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 14/963,684

(22) Filed: Dec. 9, 2015

(65) Prior Publication Data
US 2016/0276496 A1    Sep. 22, 2016

(30) Foreign Application Priority Data

Mar. 19, 2015  (FR) ...................... 15 52289

(51) Int. Cl.
*H01L 29/866* (2006.01)
*H01L 29/40* (2006.01)
*H01L 29/739* (2006.01)
*H01L 29/06* (2006.01)

(52) U.S. Cl.
CPC ......... *H01L 29/866* (2013.01); *H01L 29/0649* (2013.01); *H01L 29/0653* (2013.01); *H01L 29/402* (2013.01); *H01L 29/407* (2013.01); *H01L 29/7391* (2013.01); H01L 29/0692 (2013.01)

(58) Field of Classification Search
CPC .................... H01L 29/7391; H01L 29/866
See application file for complete search history.

(56) References Cited

U.S. PATENT DOCUMENTS 8,198,703 B2 *  6/2012  Lin ................ H01L 29/0646
                                              257/106
9,018,673 B2 *  4/2015  Chen .............. H01L 29/866
                                              257/106
2013/0082768 A1  4/2013  Hirler et al.
2013/0168768 A1  7/2013  Takada

FOREIGN PATENT DOCUMENTS

EP   0 949 683 A1   10/1999
JP   1-232773 A     9/1989
JP   3-283470 A    12/1991

* cited by examiner

*Primary Examiner* — Jeffrey Zweizig
(74) *Attorney, Agent, or Firm* — Seed IP Law Group LLP

(57) ABSTRACT

The present disclosure relates to a Zener diode including a cathode region having a first conductivity type, formed on a surface of a semiconductor substrate having a second conductivity type. The Zener diode includes an anode region having the second conductivity type, formed beneath the cathode region. One or more trench isolations isolate the cathode and anode regions from a remainder of the substrate. A first conducting region is configured to, when subjected to an adequate voltage, generate a first electric field perpendicular to an interface between the cathode and anode regions. A second conducting region is configured to, when subjected to an adequate voltage, generate a second electric field parallel to the interface between the cathode and anode regions.

20 Claims, 8 Drawing Sheets

ZENER DIODE HAVING AN ADJUSTABLE LOW BREAKDOWN VOLTAGE

BACKGROUND

Technical Field

The present disclosure relates to a Zener diode.

Description of the Related Art

Zener diodes are commonly used to regulate voltage in a circuit or to supply a stable reference voltage. For this purpose, a Zener diode is reverse-connected in parallel with a voltage source. When the voltage supplied by the voltage source reaches the breakdown voltage of the diode, the latter becomes conducting and then maintains the voltage at this value.

The present disclosure applies in particular to objects having an autonomous low power supply, to communicating objects and to energy harvesting circuits. In these applications, the breakdown voltage of the Zener diode should be as low as possible.

FIG. 1 is a cross-section of a conventional Zener diode formed in a substrate made of a semiconductor material of a first conductivity type, for example P. The Zener diode comprises a well NW having a doping of a second conductivity type, for example N, forming an anode region of the Zener diode. The Zener diode comprises a highly doped cathode region CD of the first P+-conductivity type, formed in the well NW. The region CD is formed on a region ZD having a high doping of the second N+-conductivity type. The regions CD and ZD are isolated from the rest of the well NW by a shallow trench isolation STI. The Zener diode comprises a highly doped anode connection region ED of the second N+-conductivity type formed in the well NW and isolated from the cathode region by the trench STI. Furthermore, the substrate SUB comprises a highly doped region SP of the first P+-conductivity type, forming a bias region of the substrate SUB. The substrate bias region SP is isolated from the regions CD, ZD by the shallow trench isolation STI.

FIG. 2 represents a curve C11 of variation of the current passing through the Zener diode according to the reverse voltage applied between the regions CD and ED. The curve C11 shows the operation of a conventional reverse-biased Zener diode. Between 0 and approximately 2.5V, the current passing through the diode remains low (lower than $10^{-12}$ A). From approximately 2.5V and up to approximately 5.2V, the current passing through the diode increases linearly (according to a logarithmic scale) up to approximately $10^{-8}$ A. This operating zone which results from a so-called "band to band" phenomenon cannot be used to supply a reference voltage or to perform a voltage regulation. Above approximately 5.2V, a breakdown phenomenon appears, the diode becoming highly conducting, by avalanche effect, while reaching a maximum voltage BV called "breakdown voltage" of approximately 5.5V. The diode keeps this voltage constant irrespective of the intensity of the current, provided that the latter remains between approximately $10^{-8}$ A and $10^{-6}$ A. Zener diodes are generally used in this operating zone, to supply a stable reference voltage or to perform a voltage regulation.

One proposal already made consists in lowering the breakdown voltage of a Zener diode by thinning the region ZD so as to obtain a transition between the two conductivity types of the regions CD and ZD that is as sudden as possible. However, this solution reaches a limit due to the very low thickness of the region ZD. This solution enables a current to be obtained which increases more rapidly at low voltage values than on the curve C11. The breakdown phenomenon also occurs at a lower voltage than on the curve C11, but the voltage continues to increase according to the current. The "band to band" phenomenon tends to extend over broader ranges of voltage and current values. In these conditions, the Zener diode cannot be used to supply a reference voltage or to perform a voltage regulation.

BRIEF SUMMARY

Some embodiments are directed to a Zener diode having a low breakdown voltage, lower than 1.5V. Some embodiments produce such a diode in an integrated circuit, by implementing manufacturing steps commonly used to produce CMOS transistors. Some embodiments produce a Zener diode of which the breakdown voltage can be adjusted.

Some embodiments relate to a Zener diode comprising: a cathode region having a first conductivity type, formed on the surface in a semiconductor substrate having a second conductivity type, an anode region having the second conductivity type, formed beneath the cathode region, the cathode and anode regions being isolated from the rest of the substrate by trench isolations, and first conducting regions configured, when they are subjected to adequate voltages, to generate a first electric field perpendicular to an interface between the cathode and anode regions. According to one embodiment, the Zener diode includes second conducting regions configured, when they are subjected to adequate voltages, to generate a second electric field parallel to an interface between the cathode and anode regions.

According to one embodiment, the second conducting regions include an embedded gate, separated from the anode region only by a dielectric layer of the gate.

According to one embodiment, the Zener diode includes: a well having the first conductivity type, formed in the substrate, the cathode region being formed on the surface of the well, and the anode region being formed in the well beneath the cathode region, and an anode connection region of the first conductivity type, formed on the surface of the well and isolated from the cathode region.

According to one embodiment, the well is isolated from the substrate by a shallow trench.

According to one embodiment, the gate is formed between the cathode region and an anode connection region.

According to one embodiment, the gate surrounds the cathode and anode regions.

According to one embodiment, the gate is formed in the cathode and anode regions.

According to one embodiment, the gate has an octagonal or rectangular shape.

According to one embodiment, the first and second conducting regions are interconnected.

Some embodiments may also relate to a circuit comprising a Zener diode as disclosed herein.

Some embodiments may also relate to a method for controlling a Zener diode as disclosed herein, the process comprising: applying a first voltage to the cathode region, applying to the anode region a second voltage to reverse-bias the Zener diode, the difference between the first voltage and the second voltage being greater than or equal to a breakdown voltage of the Zener diode. According to one embodiment, the method includes applying a third voltage to the second conducting regions to generate an electric field parallel to the interface between the cathode and anode regions.

According to one embodiment, the second conducting regions include an embedded gate, separated from the anode region only by a dielectric layer of the gate, the method comprising a step of applying the third voltage to the gate.

According to one embodiment, the third voltage is set equal to the first voltage.

According to one embodiment, the method includes adjusting the third voltage according to a breakdown voltage to be reached by the Zener diode.

According to one embodiment, the breakdown voltage is adjustable between 1.2 and 5V by causing the third voltage to vary between the first voltage and the second voltage.

BRIEF DESCRIPTION OF THE SEVERAL VIEWS OF THE DRAWINGS

Some examples of embodiments of the present disclosure will be described below in relation with, but not limited to, the appended figures, in which.

DETAILED DESCRIPTION

Figure 1:
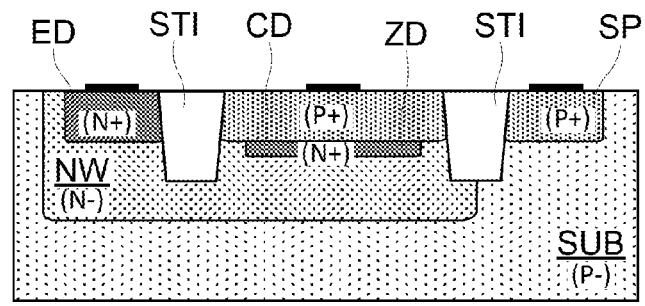
FIG. 1 is a cross-section of a conventional Zener diode.
Figure 2:
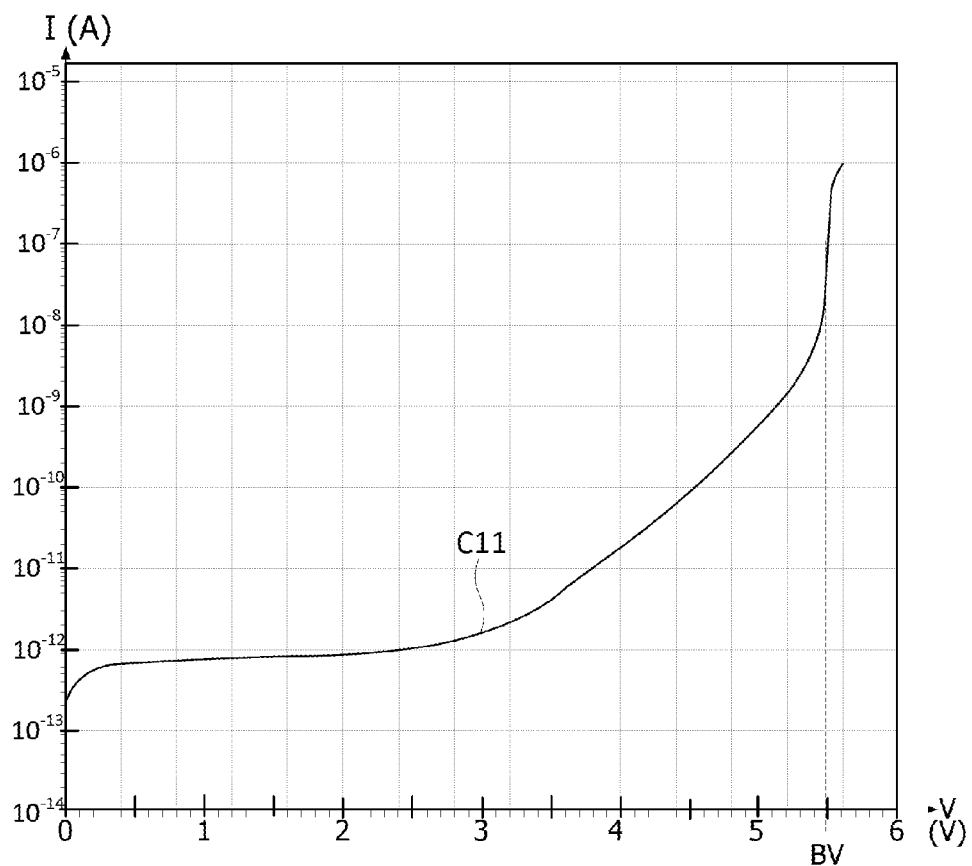
FIG. 2 represents a characteristic curve of current according to the voltage at the terminals of a conventional Zener diode.
Figure 3:
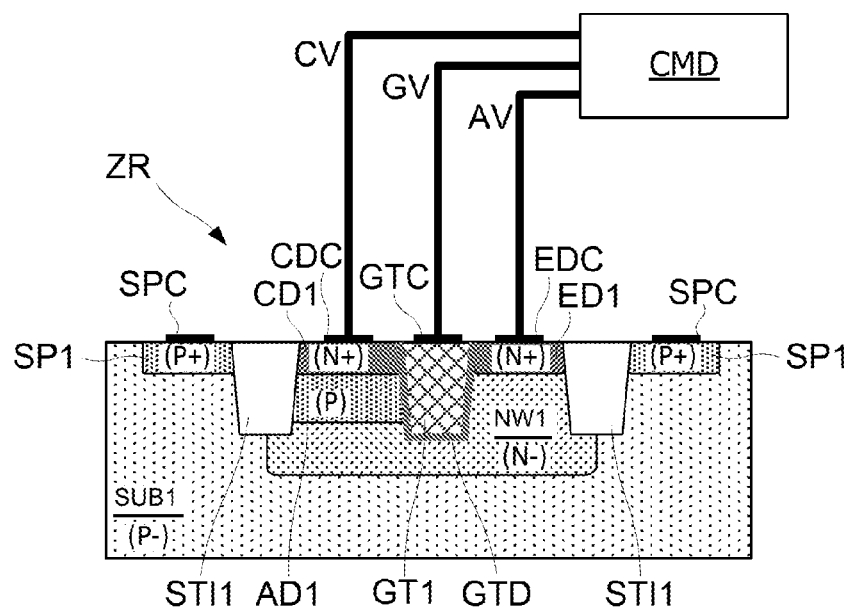
FIG. 3 is a cross-section of a Zener diode according to one embodiment.

FIG. 3 represents a Zener diode ZR according to one embodiment. The Zener diode is formed in a substrate SUB1 made of a semiconductor material having a doping of a first conductivity type, for example P. The Zener diode ZR includes a cathode region CD1 having a high doping of a second conductivity type, for example N+, superimposed on an anode region AD1 having a doping of the first conductivity type (P). The regions CD1, AD1 are formed in a well NW1 having a doping of the first conductivity type (N in the example considered), which is formed in the substrate SUB1. Thus, the Zener diode ZR includes a junction zone NPN formed by the region AD1 and in particular by the interfaces between the region AD1 and the region DC1 and between the region AD1 and the well NW1. The well NW1 is isolated from the rest of the substrate SUB1 by a shallow trench isolation STI1. The Zener diode ZR also includes a highly doped region ED1 of the second conductivity type (N+), forming a region for biasing the well NW1 and for connecting the anode of the diode ZR. Furthermore, the substrate SUB1 includes one or more highly doped regions SP1, of the first conductivity type (P+), forming bias regions of the substrate SUB1. The Zener diode ZR also includes a cathode contact pad CDC formed on the region CD1, and an anode contact pad EDC formed on the region ED1. One or more bias contacts SPC of the substrate are formed on the substrate SUB1 bias regions SPP.

According to one embodiment, the Zener diode ZR includes a vertical embedded gate GT1, formed in the well NW1, so as to be separated from the regions CD1, AD1 and ED1, and from the well NW1, only by a dielectric layer GTD. The gate GT1 is provided to receive a bias voltage GV through a gate contact pad GTC. The voltage GV can be supplied by a circuit CMD also supplying the cathode contact pad CDC with a cathode voltage CV and the anode contact pad EDC with an anode voltage AV. The dielectric layer GTD can have a thickness between 5 and 15 nm, depending on the manufacturing technology used and the voltages to be implemented. Thus, the layer GTD can have a thickness in the order of 10 nm.

The gate GT1 can be produced by etching a hole or a trench in the substrate SUB1, by forming on the walls and the bottom of the trench the dielectric layer GTD, for example by oxidation, and then by filling the trench with a conducting material such as a metal or polycrystalline silicon. These manufacturing steps, and those enabling the different doped regions and the trench STI1 to be formed, are commonly implemented to produce CMOS transistor-based circuits.

Figure 4:
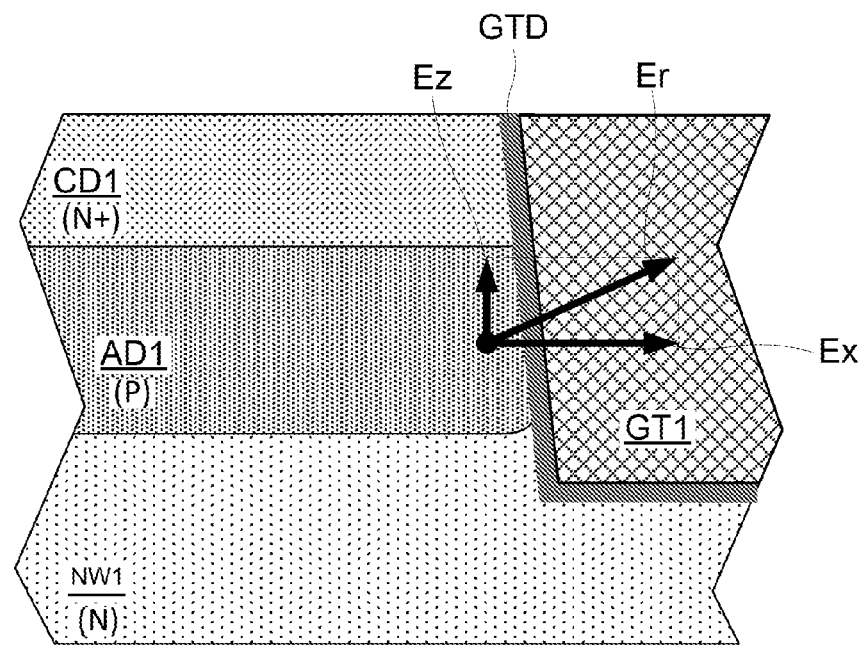
FIG. 4 is a detailed partial cross-section of the Zener diode of FIG. 3.

FIG. 4 represents in greater detail the junction zone NPN of the Zener diode ZR made up of the region AD1 in contact with the well NW1 and the region CD1, and in particular, the portion of the junction zone NPN in the vicinity of the gate GT1. When the Zener diode ZR is reverse-biased, the cathode contact pad CDC receives a voltage lower than the voltage applied to the well bias contact pad EDC. In these conditions, an electric field Ez directed from the region AD1 towards the region CD1 appears in the region AD1. If the gate GT1 receives a positive voltage, an electric field Ex directed towards the gate GT1 also appears in the region AD1, parallel to the interface plane between the regions CD1 and AD1. The simultaneous presence of the electric fields Ez and Ex forms a resulting field Er directed in the angular sector between the directions of the fields Ez and Ex. It can be seen that the amplitude of the field Er is higher than that of the field Ez. In addition to this effect of increasing the electric field, there is a proximity effect, as the gate GT1 is directly in contact with the junction zone NPN. The result is that the charges present in the junction zone NPN undergo a higher electric field and thus become mobile under the effect of a lower voltage applied to the region CD1, this mobility resulting in a breakdown phenomenon by avalanche effect. Thus, the gate GT1 is used here as an electrically conducting element to bring a voltage in the vicinity of the junction zone NPN, so as to generate the electric field Ex.

Figure 5:
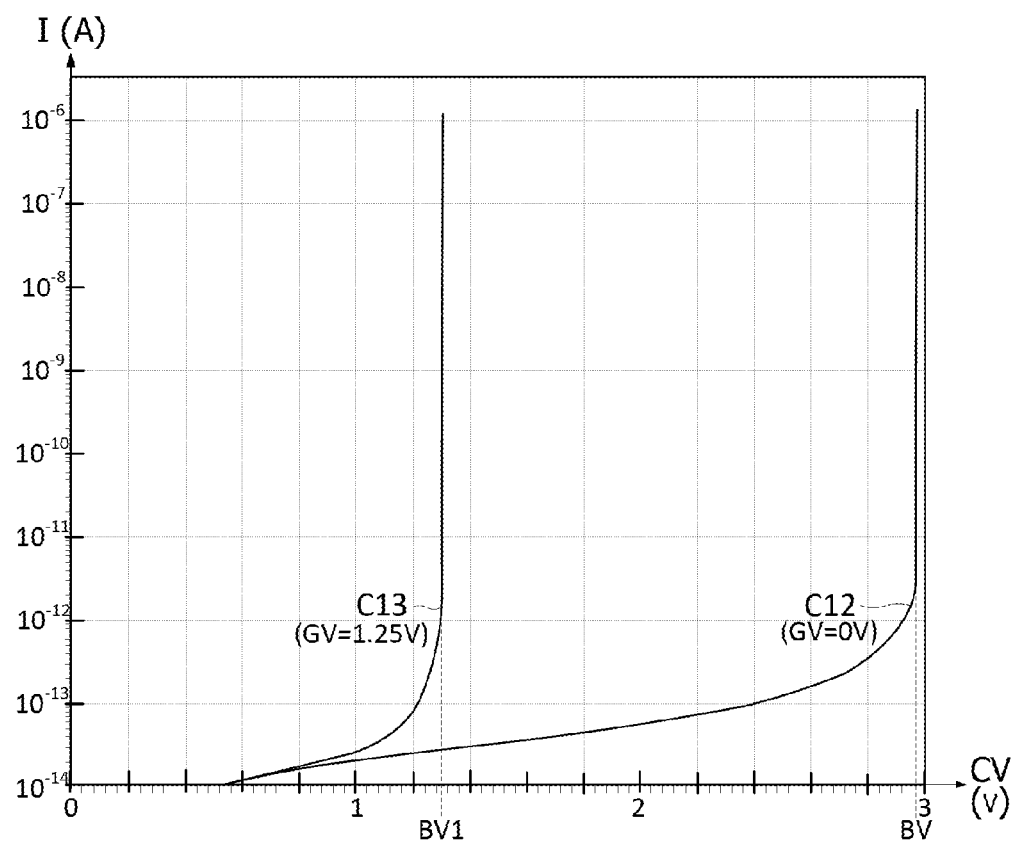
FIG. 5 represents characteristic curves of the current according to the voltage at the terminals of the Zener diode of FIG. 3.

FIG. 5 represents curves C12, C13 of variation of the current passing through the Zener diode ZR according to the voltage CV applied to the cathode region CD1, the voltage AV applied to the anode connection region ED1 being zero and the voltage applied to the region SPC being zero too. In the case of the curve C12, the gate GT1 receives a voltage equal to the anode voltage AV applied to the contact pad EDC, for example set to 0V. In the case of the curve C13, the gate GT1 receives a voltage GV of approximately 1.3V. Between 0 and approximately 2.7V for the curve C12, and approximately 1.1V for the curve C13, the current passing through the diode ZR linearly increases according to a logarithmic scale, while remaining very low (lower than $10^{-13}$ A). Above 1.1V for the curve C12 and 2.7V for the curve C13, a breakdown phenomenon appears, the diode ZR becoming highly conducting at a breakdown voltage BV of approximately 2.9V for the curve C12, and a breakdown voltage BV1 of approximately 1.3V for the curve C13. The diode ZR keeps this voltage constant irrespective of the intensity of the current, provided that the latter remains greater than approximately $5.10^{-12}$ A. The curve C13 can also be obtained by setting the voltage GV applied to the gate GT1 to a voltage equal to or greater than the breakdown voltage BV1, for example to a value between 1.3 and 1.5V.

If the voltage of the gate GT1 is increased from the anode voltage AV for example set to 0V (curve C12), a curve having substantially the same shape as the curves C12 and C13, situated between the latter, is obtained. The comparison of the curves C12 and C13 shows that the application on the gate GT1 of a voltage which switches from the anode voltage AV (i.e., 0V) to the voltage BV1 enables the breakdown voltage of the diode ZR to be decreased from the voltage BV to the voltage BV1.

According to one embodiment, the breakdown voltage BV, BV1 of the diode ZR is controlled, for example by the circuit CMD, by adjusting the voltage GV applied to the gate GT1 between the anode voltage AV and the cathode voltage CV. In this way, the Zener diode ZR can be used to produce an adjustable reference voltage source or a voltage regulator having an adjustable setpoint voltage.

Figure 6:
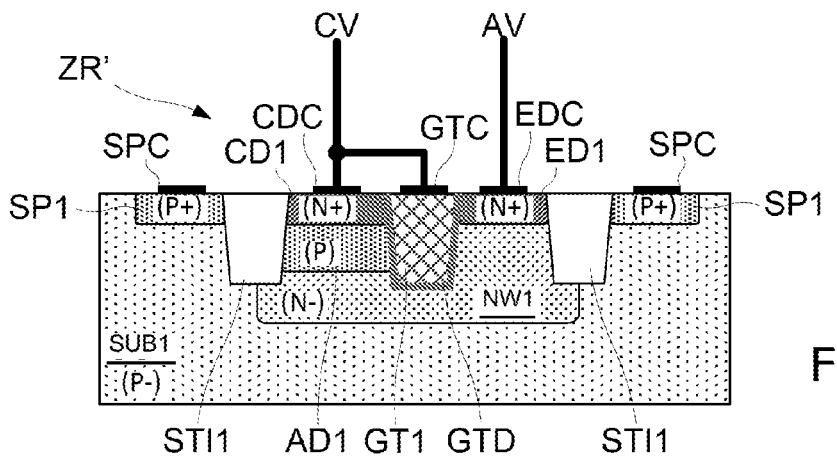
FIG. 6 is a cross-section of a Zener diode according to another embodiment.

FIG. 6 represents a Zener diode ZR' having a low breakdown voltage, according to another embodiment. The diode ZR' differs from the Zener diode ZR in that it comprises not three connection terminals formed by the contact pads CDC, EDC, GTC, but only two connection terminals formed by the cathode CDC and anode EDC contact pads, the gate contact pad GTC being coupled to the cathode contact pad CDC.

Figure 6A:
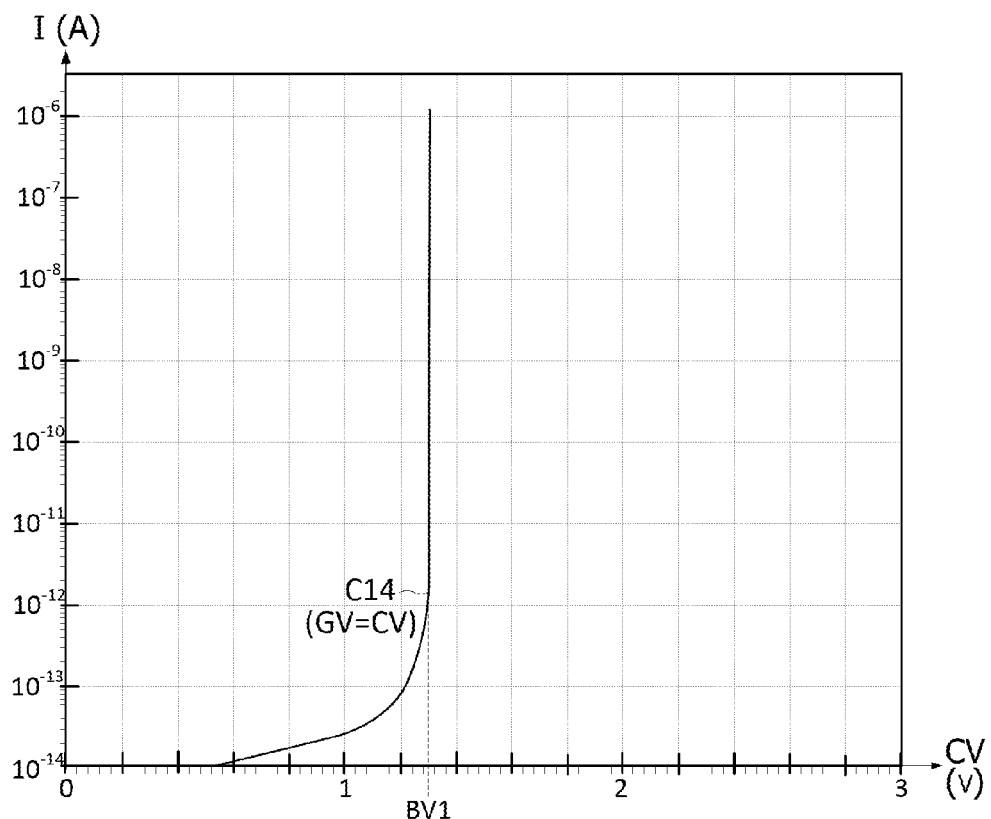
FIG. 6A represents a characteristic curve of the current according to the voltage at the terminals of the Zener diode of FIG. 6.

FIG. 6A represents a curve C14 of variation of the current passing through the Zener diode ZR' according to the voltage CV applied to the cathode region CD1, the voltage AV applied to the anode connection region ED1 being zero and the voltage applied to the region SPC being zero too. The curve C14 substantially corresponds to the curve C13 of FIG. 5, the Zener diode ZR' having the breakdown voltage BV1. The connection between the contact pads CDC and GTC can be achieved for example by a single contact pad covering the cathode regions CD1 and the gate GT1.

Figure 7:
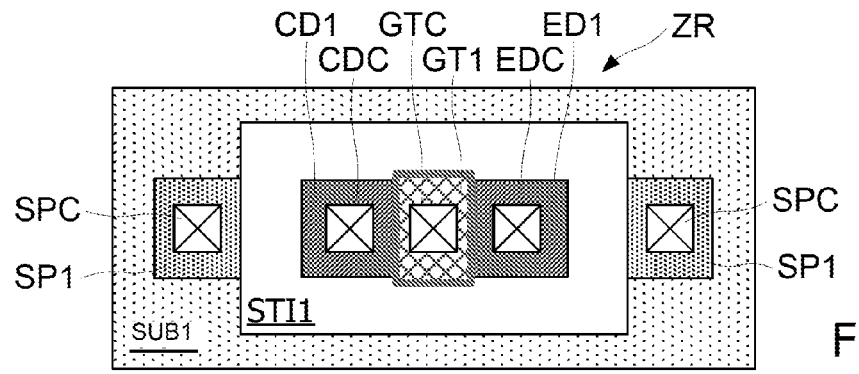
FIG. 7 is a top view of the Zener diode, according to one embodiment.

FIG. 7 is a top view of the Zener diode ZR according to one embodiment. In the embodiment shown in FIG. 7, the gate GT1 isolates the regions CD1, AD1 from the bias region ED1. The trench STI1 surrounds a zone comprising the regions CD1, AD1, the gate GT1 and the region ED1. One or more regions SP1 for biasing the substrate SUB1 can be formed around the diode ZR delimited by the trench STI1.

Figure 8:
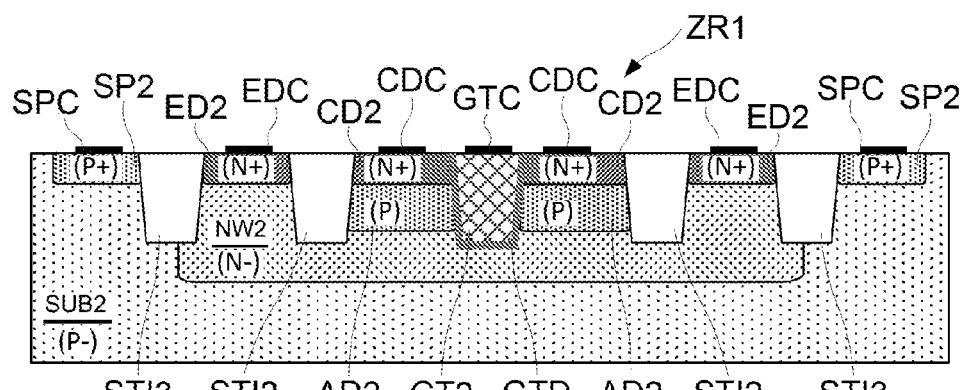
FIGS. 8 and 9 are a cross-section and a top view of a Zener diode, according to another embodiment.
Figure 9:
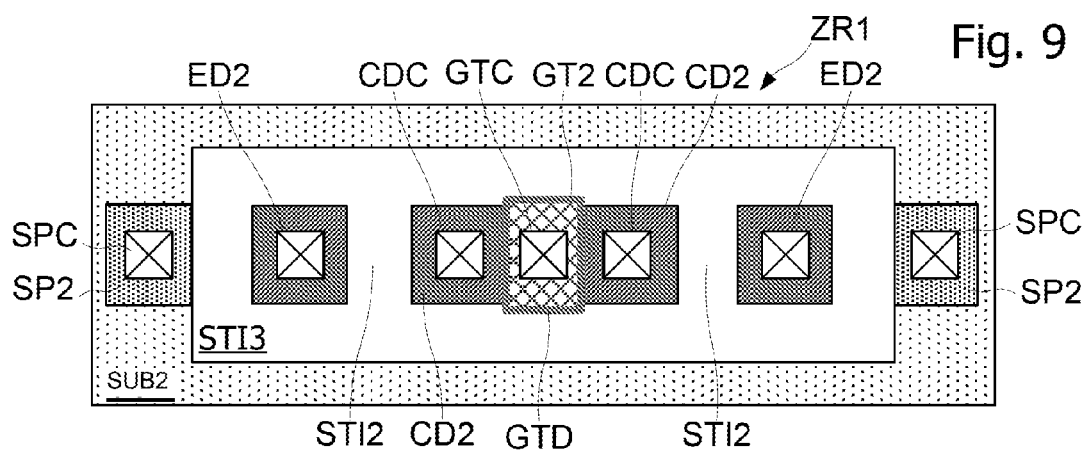

FIGS. 8 and 9 illustrate a cross-section and top view, respectively, of a Zener diode ZR1 according to another embodiment. The diode ZR1 includes a cathode region CD2 having a high doping of the second conductivity type (N+), superimposed on an anode region AD2 having a doping of the first conductivity type (P). The regions CD2, AD2 are formed in a well NW2 having a doping of the second conductivity type (N), which is formed in the substrate SUB2.

According to one embodiment, an embedded gate GT2 is formed in the regions CD2, AD2, so as to be in contact with the junction zone NPN of the diode ZR1. The regions CD2, AD2 including the gate GT2, are isolated from the rest of the well NW2 by a shallow trench isolation STI2. The Zener diode ZR1 also includes in the well NW2, a highly doped region ED2 of the second conductivity type (N+), forming a region for biasing the well NW2 and for connecting the anode of the diode ZR1. The well NW2 is isolated from the rest of the substrate SUB2 by a shallow trench isolation STI3. Furthermore, the substrate SUB2 includes one or more highly doped regions SP2, of the first conductivity type (P+), forming bias regions of the substrate SUB2. The Zener diode ZR1 also includes a cathode contact pad CDC formed on the region CD2, an anode contact pad EDC formed on the region ED2, and a gate contact pad GTC formed on the gate GT2. One or more bias contacts SPC are formed on the substrate SUB2 bias regions SP2.

As can be seen from FIG. 9, the trench isolations STI2, STI3 isolate three regions, i.e., a central region and two lateral regions including the anode connection regions ED2, on either side of the central region. The central region includes the gate GT2 and on either side of the gate, the cathode regions CD2.

Figure 10:
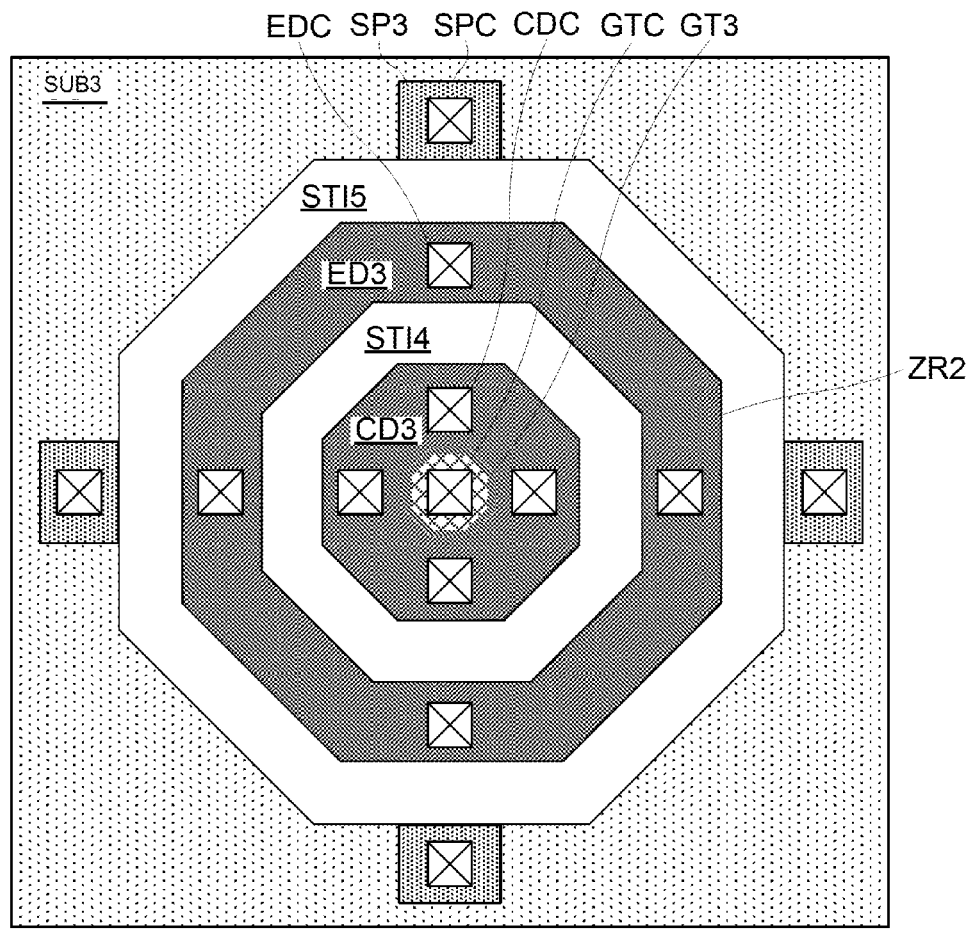
FIG. 10 is a top view of a diode according to another embodiment.

FIG. 10 represents a top view of a Zener diode ZR2 having a cross-section configuration which can be similar to that of FIG. 8, according to another embodiment. The diode ZR2 includes a cathode region CD3 superimposed on an anode region, surrounding an embedded gate GT3, the cathode region CD3 being surrounded by a trench isolation STI4. The diode ZR2 also includes an anode connection region ED3 surrounding the trench isolation STI4 and which is isolated from the substrate SUB3 by a trench isolation STI5. The cathode CD3 and anode connection ED3 regions, and the trenches STI4, STI5 have an octagonal shape. The gate GT3 may have a square shape or more generally a rectangular, or even octagonal, shape.

Figure 11:
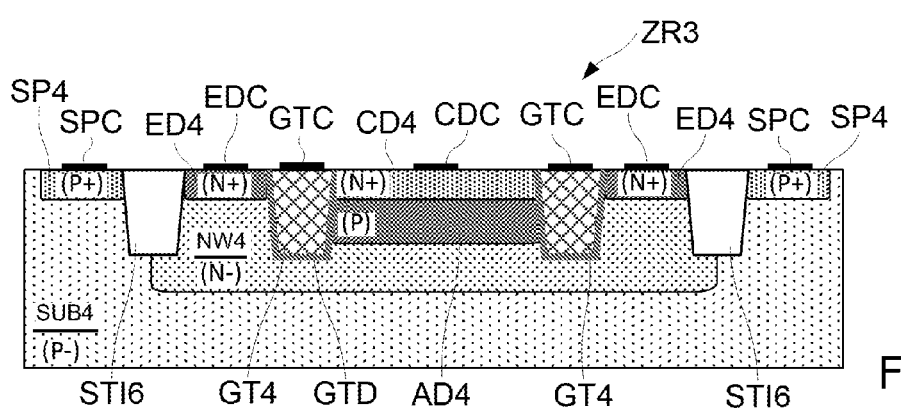
FIGS. 11 and 12 are a cross-section and a top view of a Zener diode, according to another embodiment.
Figure 12:
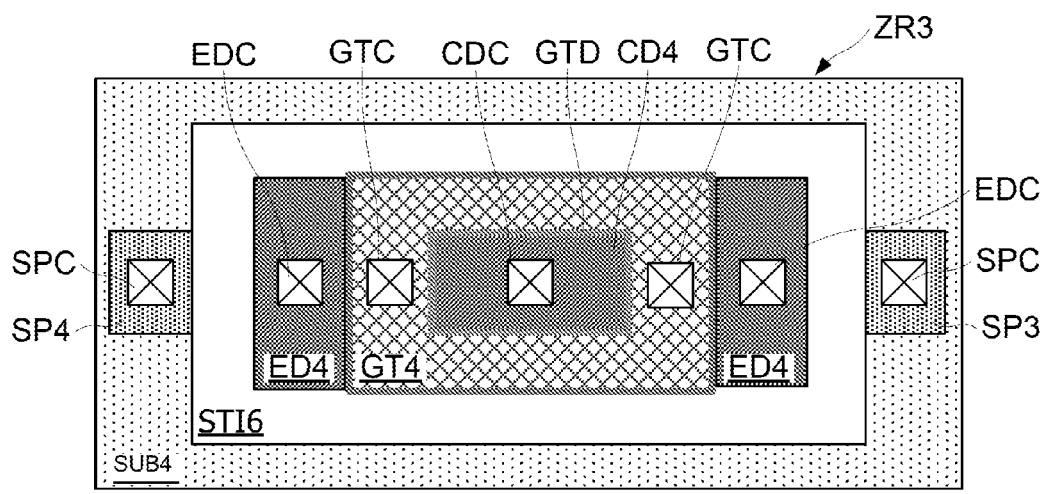

FIGS. 11 and 12 represent a cross-section and top view, respectively, of a Zener diode ZR3 including a cathode region CD4 having a high doping of the second conductivity type (N+), superimposed on an anode region AD4 having a doping of the first conductivity type (P). The regions CD4, AD4 are formed in the well NW4 and isolated from the rest of the well NW4 by an embedded gate GT4 formed in a trench surrounding the regions CD4, AD4. Anode connection regions ED4 are formed in the well NW4 along external edges of the gate GT4. The well NW4 is isolated from the substrate SUB4 by a trench isolation STI6 surrounding the gate GT4 and the anode connection regions ED4.

Figure 13:
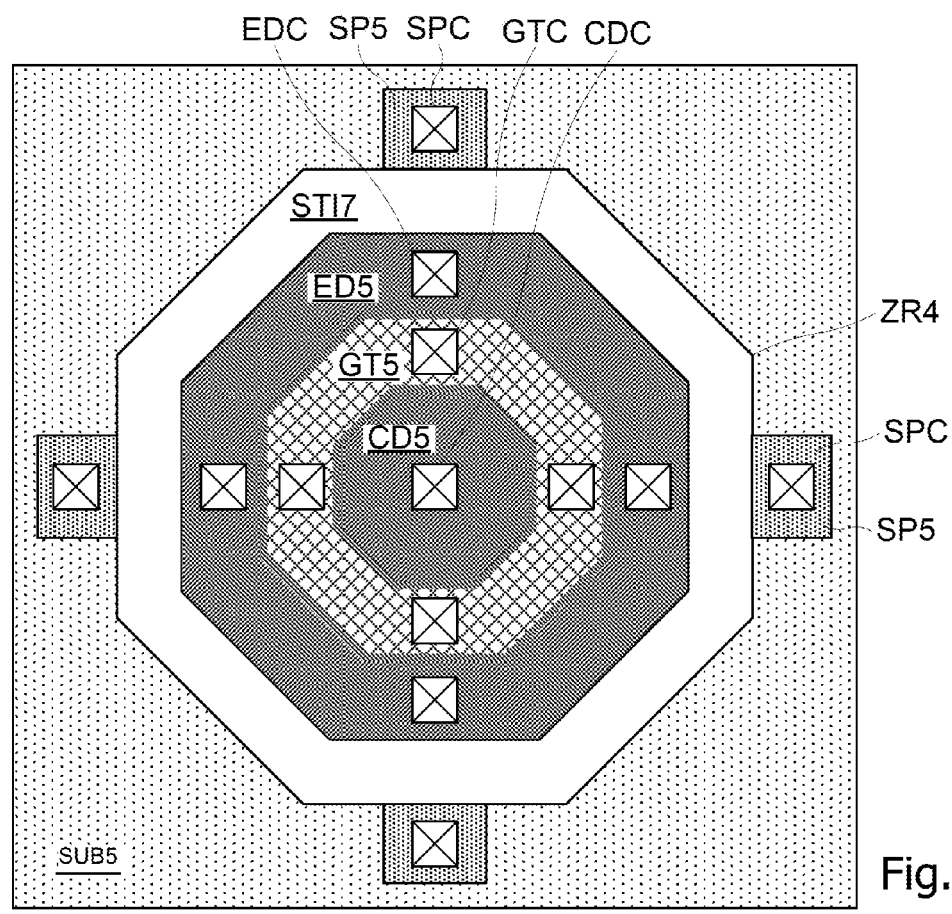
FIG. 13 is a top view of a Zener diode, according to another embodiment.

FIG. 13 represents a top view of a Zener diode ZR4 having a cross-section configuration which can be similar to that of FIG. 11, according to another embodiment. The diode ZR4 includes a cathode region CD5 superimposed on an anode region, and surrounded by an embedded gate GT5, the gate GT5 being surrounded by an anode connection region ED5. The diode ZR4 also includes a shallow trench isolation STI7 isolating the anode connection region ED5 and the well (e.g., the well NW4 shown in FIG. 11) from the substrate SUB5. The cathode CD5 and anode connection ED5 regions, and the gate GT5 and the trenches STI7 have an octagonal shape.

It will be understood by those skilled in the art that the present disclosure is susceptible of various alternative embodiments and various applications. In particular, the disclosure is not limited to the shapes of the different regions of the Zener diodes presented. Shapes other than the rectangular and octagonal shapes described can be considered for the different regions of the Zener diode. Thus, circular and square shapes and other polygonal shapes can be considered for these regions.

Figure 14:
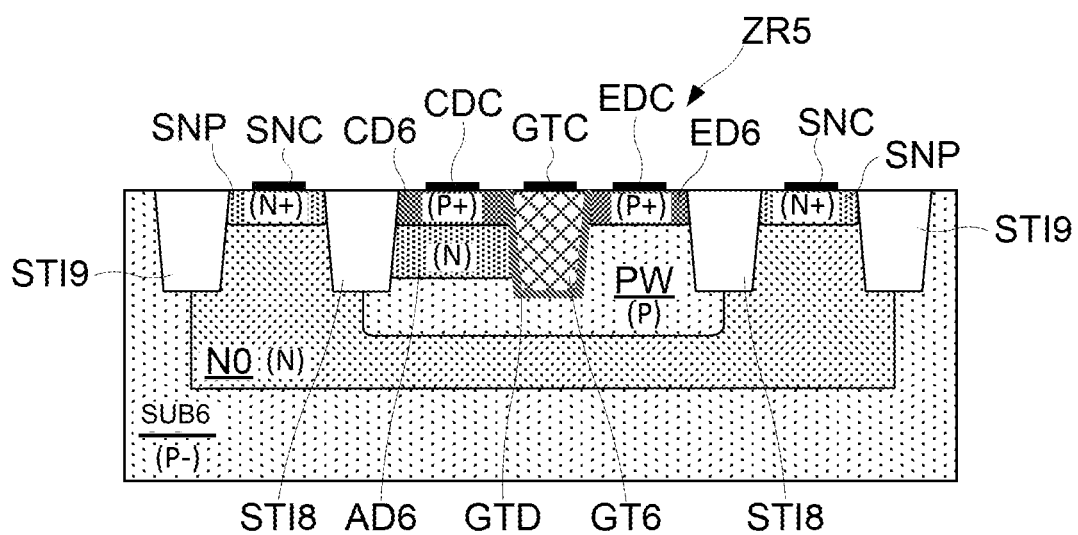
FIG. 14 is a cross-section of a Zener diode, according to another embodiment.

Furthermore, in all the embodiments described above, the conductivity types of the doping of the different regions forming the Zener diode can be inverted. Thus, FIG. 14 represents a Zener diode ZR5 having the shape of the diode ZR (shown, for example, in FIG. 3), formed in a well PW having a doping of the first conductivity type (P), the well PW being formed in a well NO formed by deeply implanting dopants of the second conductivity type (N) in the substrate SUB6. As above, the well PW is isolated from the well NO by a trench isolation STI8. The well NO may be isolated from the substrate SUB6 by shallow trench isolations STI9. The diode ZR5 includes a vertical gate GT6 embedded in the well PW. In the example of FIG. 14, the gate GT6 delimits on one side with the trench isolation STI8 a highly doped cathode region CD6 of the first conductivity type (P+), superimposed on an anode region AD6 of the second conductivity type (N). The gate GT6 delimits on another side with the trench isolation STI8 a highly doped anode connection region ED6 of the first conductivity type (P+). The regions CD6 and ED6 are topped by respective contact pads CDC and EDC. The well NO is biased (grounded) through highly doped bias regions SNC of the second conductivity type (N+), each topped by a bias contact pad SNC. It shall be noted that the Zener diode ZR5 is reverse-biased by applying to the cathode contact pad CDC a voltage lower than the voltage applied to the bias contact pad EDC for biasing the well PW.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A Zener diode comprising:
   a cathode region having a first conductivity type, formed on a surface of a semiconductor substrate having a second conductivity type,
   an anode region having the second conductivity type, formed beneath the cathode region,
   one or more trench isolations isolating the cathode and anode regions from a remainder of the substrate,
   a first conducting region configured to, when subjected to an adequate voltage, generate a first electric field perpendicular to an interface between the cathode and anode regions, and
   a second conducting region configured to, when subjected to an adequate voltage, generate a second electric field parallel to the interface between the cathode and anode regions.

2. The Zener diode according to claim 1, wherein the second conducting region includes an embedded gate, the Zener diode including a dielectric layer separating the embedded gate from the anode region.

3. The Zener diode according to claim 2, the Zener diode including an anode connection region, the gate being positioned between the cathode region and the anode connection region.

4. The Zener diode according to claim 2, wherein the gate completely laterally surrounds the cathode and anode regions.

5. The Zener diode according to claim 2, wherein the gate is formed in the cathode and anode regions.

6. The Zener diode according to claim 2, wherein the gate has an octagonal shape.

7. The Zener diode according to claim 1, comprising:
   a well having the first conductivity type, formed in the substrate, the cathode region being formed on a surface of the well, and the anode region being formed in the well beneath the cathode region, and
   an anode connection region of the first conductivity type, formed on the surface of the well and isolated from the cathode region.

8. The Zener diode according to claim 7, comprising a shallow trench isolating the well from the substrate.

9. The Zener diode according to claim 1, wherein the first and second conducting regions are electrically coupled to each other.

10. The Zener diode according to claim 9, comprising a single contact pad electrically coupled to the first and second conducting regions.

11. A circuit comprising:
    a Zener diode, the Zener diode including:
      a cathode region having a first conductivity type, formed on a surface of a semiconductor substrate having a second conductivity type,
      an anode region having the second conductivity type, formed beneath the cathode region,
      one or more trench isolations isolating the cathode and anode regions from a remainder of the substrate,
      a first conducting region configured to, when subjected to an adequate voltage, generate a first electric field perpendicular to an interface between the cathode and anode regions, and
      a second conducting region configured to, when subjected to an adequate voltage, generate a second electric field parallel to the interface between the cathode and anode regions; and
    circuitry configured to supply a first voltage to the first conducting region, and a second voltage to the second conducting region.

12. The circuit according to claim 11, the circuit being configured to control a breakdown voltage of the Zener diode by adjusting the second voltage.

13. The circuit according to claim 12, the circuit comprising a voltage regulator having an adjustable set-point voltage.

14. The circuit according to claim 11, wherein the second conducting region includes an embedded gate, the Zener diode including a dielectric layer separating the embedded gate from the anode region.

15. The circuit according to claim 14, wherein the gate completely laterally surrounds the cathode and anode regions.

16. A method for controlling a Zener diode, the Zener diode including:
    a cathode region having a first conductivity type, formed on a surface of a semiconductor substrate having a second conductivity type,
    an anode region having the second conductivity type, formed beneath the cathode region,
    one or more trench isolations isolating the cathode and anode regions from a remainder of the substrate, and
    a conducting region,
    the method comprising:
    applying a first voltage to the cathode region,
    applying to the anode region a second voltage to reverse-bias the Zener diode, the difference between the first voltage and the second voltage being greater than or equal to a breakdown voltage of the Zener diode; and applying a third voltage to the conducting region to generate an electric field parallel to an interface between the cathode and anode regions.

17. The method according to claim 16, wherein the conducting region includes an embedded gate, the Zener diode comprising a dielectric layer separating the embedded gate from the anode region, the method comprising:
applying the third voltage to the gate.

18. The method according to one claim 16, wherein the third voltage is set equal to the first voltage.

19. The method according to claim 16, comprising adjusting the third voltage according to a breakdown voltage to be reached by the Zener diode.

20. The method according to claim 16, comprising:
controlling the breakdown voltage between 1.2 and 5V by varying the third voltage between the first voltage and the second voltage.

* * * * *